Figure 1:
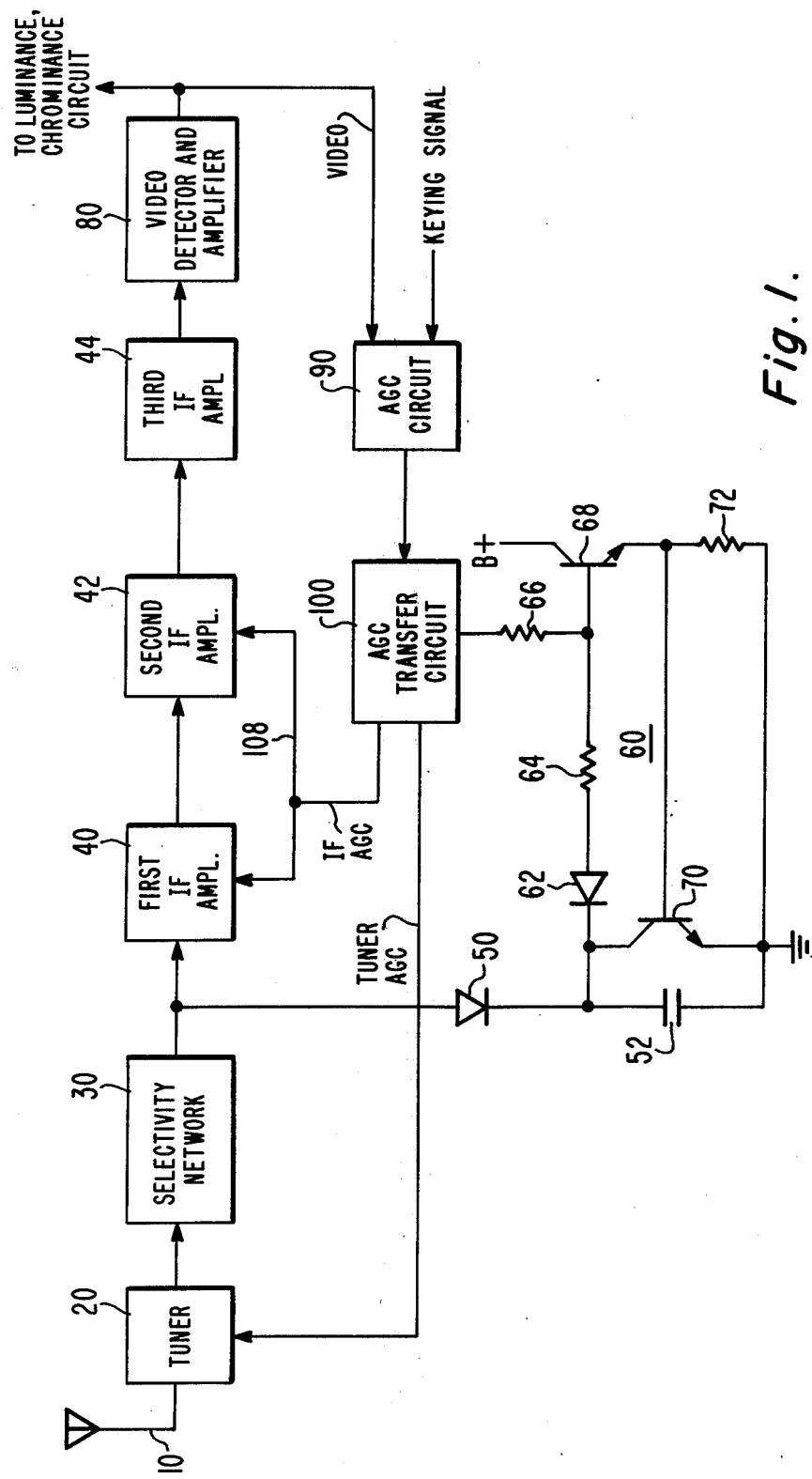

United States Patent [19]

Harford

[11] 4,172,239

[45] Oct. 23, 1979

[54] SIGNAL ATTENUATOR

[75] Inventor: Jack R. Harford, Flemington, N.J.

[73] Assignee: RCA Corporation, New York, N.Y.

[21] Appl. No.: 949,068

[22] Filed: Oct. 6, 1978

[51] Int. Cl.$^2$ ............................................. H03G 3/20
[52] U.S. Cl. .................................... 330/298; 330/133; 330/280; 330/284
[58] Field of Search ............... 330/133, 138, 144, 145, 330/207 P, 284, 298, 280; 325/319, 362, 405, 410, 413; 358/27, 174

[56] References Cited

U.S. PATENT DOCUMENTS 3,061,785   10/1962   Battin ............................... 330/298 X

OTHER PUBLICATIONS

RCA Television Service Data, file 1976, c-3, CTC 71 Series Chassis, copyright 1976.

Primary Examiner—James B. Mullins
Attorney, Agent, or Firm—Eugene M. Whitacre; William H. Meagher; W. Brinton Yorks, Jr.

[57]                ABSTRACT

A circuit is provided for protecting an amplifier from signal overload upon the application of strong signals at the input to the amplifier. A unidirectionally conducting semiconductor device and a capacitor are serially coupled between the input to the amplifier and ground. Means for maintaining a constant voltage is coupled to the junction of the semiconductor device and the capacitor. Upon the application of a strong signal at the input to the amplifier, the semiconductor device conducts current to the junction of the constant voltage means and the capacitor, causing the voltage across the capacitor to increase. The constant voltage means senses this voltage increase, and responds by opposing the voltage increase so as to maintain a substantially constant voltage across the capacitor. The constant voltage at the junction of the semiconductor device and the capacitor maintains the semiconductor device in a low impedance state, thereby attenuating the strong signal at the input to the amplifier. The circuit may also be operated in a second mode, in which current conduction by the semiconductor device and constant voltage means is under the control of the AGC system to attenuate the input signal to an I.F. amplifier.

5 Claims, 2 Drawing Figures

SIGNAL ATTENUATOR

This invention relates to television amplifying devices, and more particularly to a circuit which attenuates the input signal to a television amplifier.

In order to reproduce a televised image on a television kinescope with correct contrast and color saturation characteristics, it is necessary to maintain constant minimum and maximum amplitudes of the detected video signal. This is accomplished by automatically controlling the gain of radio frequency and intermediate frequency amplifiers in the television receiver in response to the strength of the received radio frequency signal. The automatic gain control (AGC) system senses the level of the detected video signal and controls the gain of the R.F. and I.F. amplifiers so as to maintain the synchronizing signal pulses of the video signal at a constant desired amplitude. When the signal levels of the constant amplitude sync pulses are properly maintained, the signal level at the picture information portion of the video signal will also be at the correct signal level.

Since the AGC system maintains the signal level of the sync pulses, it is not necessary for the system to continuously monitor the video signal level. The video signal must only be sampled during the sync pulse intervals, while the picture information levels may be safely ignored. This is normally done by activating, or keying, the AGC system during the sync pulse intervals. Keying pulses are supplied by a retrace (flyback) transformer in the horizontal deflection system, which is synchronized to the sync pulses of the video signal. In this way, the AGC system will only sample the levels of the sync pulses of the video signal, which recur in time synchronism with the keying pulses.

The AGC system will operate as described above for continuous signal variations resulting from such causes as airplanes passing nearby and signal fading. However, operation of the AGC system can be inhibited by sudden signal discontinuities, which cause a condition known as "lockout." For instance, if the television receiver is tuned to a weak signal channel, or is switched through one or more channels which are unused in the local reception area, the AGC system will be operating in a maximum gain condition. When the receiver is suddenly switched to a strong signal channel, the received R.F. signal can cause the R.F. and I.F. amplifiers to overload. In the overload condition, the gain-controlled amplifiers can remove, or strip off, the sync pulses from the video signal. The horizontal deflection system will therefore be unable to synchronize the AGC keying pulses to the received sync pulses, and the keying pulses will drift in phase relative to the video signal, causing the AGC system to sample the varying amplitude of the picture information interval of the video signal. Since the level of the picture information is generally at an amplitude which would indicate a lower than nominal sync level to the AGC system, the system will respond by increasing the gain of the receiver even further. The increased gain only accelerates the lockout situation, which can continue indefinitely.

In accordance with the present invention, a circuit is provided which attenuates an input signal to an amplifier. A unidirectionally conducting semiconductor device is coupled between the input to an amplifier and means for developing a constant voltage. A capacitor is coupled from the junction of the semiconductor device and the constant voltage means to a source of reference potential. When signals of a desired (normal) signal level appear at the input to the amplifier, the semiconductor device will be cut off, or will conduct only a small amount of current to the constant voltage means, which has substantially no effect on the input signals. When the signals at the input to the amplifier increase beyond the range of desired signal levels, the current conducted by the semiconductor device increases substantially. The increased current flow increases the voltage across the capacitor. The increased voltage level is detected by the constant voltage means, which responds by opposing the voltage change across the capacitor. The substantially constant voltage at the junction of the semiconductor device and the capacitor maintains the semiconductor device in a low impedance state, allowing the semiconductor device to attenuate the signals at the input to the amplifier.

The semiconductor device and the constant voltage means may also be operated in a second mode, in which current conduction by the semiconductor device and constant voltage means is under the control of the AGC system to attenuate the input signals to an I.F. amplifier.

Figure 2:
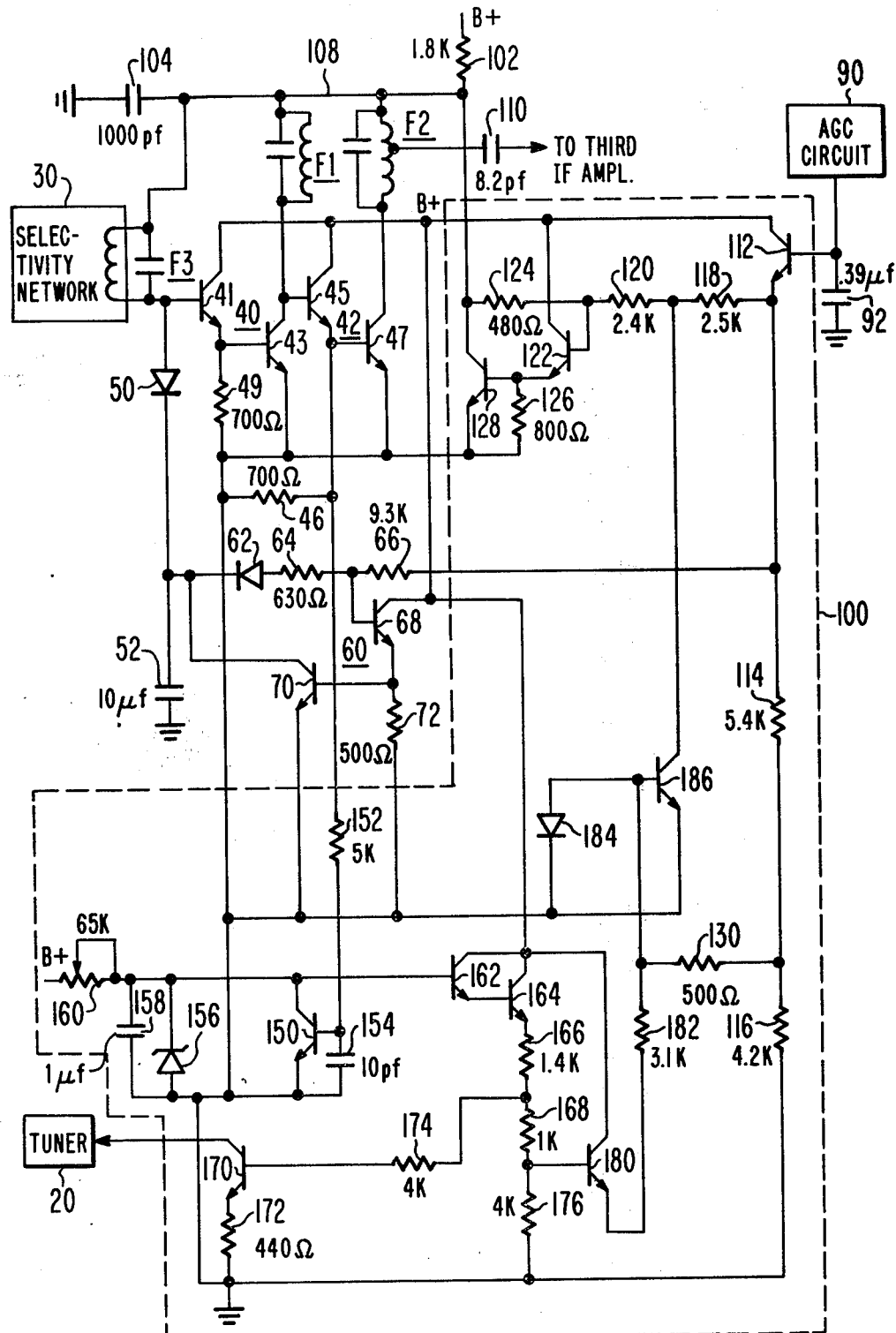

In the drawings:

FIG. 1 illustrates, partially in block diagram form and partially in schematic diagram form, an AGC system and attenuator circuit constructed in accordance with the principles of the present invention; and FIG. 2 illustrates, partially in block diagram form and partially in schematic diagram form, a more detailed embodiment of the AGC system and attenuator circuit of FIG. 1.

Referring to FIG. 1, an antenna 10 receives a broadcast radio frequency television signal, which is coupled to a tuner 20. The tuner 20 amplifies the received signal and converts the radio frequency signal to an intermediate frequency (I.F.) signal. The I.F. signal is coupled to a selectivity network 30, which has a passband to reject signals having frequencies above and below the desired range of I.F. signals.

The desired I.F. signals are coupled from the selectivity network 30 to a first I.F. amplifier 40, where they are amplified and coupled to a second I.F. amplifier 42. The second I.F. amplifier 42 amplifies the I.F. signals further, which are then coupled to a third I.F. amplifier 44. The amplified signals produced by the third I.F. amplifier are applied to a video detector and amplifier 80, which produces an amplified video signal. The video signal is coupled to an AGC circuit 90, and also applied to the luminance and chrominance circuits of the television receiver (not shown) for further signal processing.

The AGC circuit 90 samples the video signal when keyed by keying pulses. The keying pulses may be supplied by the retrace (flyback) transformer associated with the horizontal deflection circuit of the television receiver. Under normal operating conditions, the keying pulses recur in time synchronism with the sync pulse intervals of the video signal. The AGC circuit develops an AGC control voltage, which varies in level in accordance with the levels of the sync pulses. The AGC circuit may be of the type described in my U.S. Pat. No. 3,835,248, entitled "Keyed AGC Circuit."

The AGC control voltage is applied to an AGC transfer circuit 100. The transfer circuit 100 develops an AGC voltage on an I.F. AGC bus 108 to control the gain of the first and second I.F. amplifiers 40 and 42. The AGC transfer circuit 100 also provides a delayed AGC signal to the tuner 20 to control the tuner gain when the received radio frequency signal has reached a predetermined level.

The I.F. signal produced by selectivity network 30 and applied to the first I.F. amplifier 40 is also coupled to the anode of a diode 50. The cathode of diode 50 is coupled to a source of reference potential (ground) by a capacitor 52, and to the input of a negative feedback amplifier 60 at the cathode of a diode 62. Capacitor 52 bypasses the input of the negative feedback amplifier 60 to ground for I.F. frequencies. The anode of diode 62 is coupled to the base of a transistor 68 by a resistor 64. The base of transistor 68 is biased by a resistor 66, which is coupled from the AGC transfer circuit 100 to the base of transistor 68. Transistor 68 has a collector electrode coupled to a source of supply voltage (B+) and an emitter electrode coupled to ground by a resistor 72, and to the base of a transistor 70. Transistor 70 has an emitter electrode coupled to ground, and a collector electrode coupled to the input of negative feedback amplifier 60 at the cathode of diode 62.

The circuit path consisting of diode 62, resistor 64, and transistors 68 and 70 comprises the negative feedback loop of the negative feedback amplifier 60. The feedback amplifier 60, together with diode 50, cooperate to attenuate large signals at the input to the first I.F. amplifier 40.

When the I.F. signals applied to the first I.F. amplifier 40 are within the range of input signal levels for which the amplifier is designed (e.g., up to 13 millivolts), diode 50 conducts only a small amount of current (100-200 microamperes) to the input of the feedback amplifier 60, which is then conducted to ground by transistor 70. When conducting only this small amount of current, the impedance presented at the input to the first I.F. amplifier 40 by the diode 50 is high, and the level of the I.F. signal at that point is substantially unaffected.

When strong I.F. signals (e.g., greater than 100 millivolts) are applied to the input of the first I.F. amplifier 40, diode 50 begins to conduct a substantial amount of current and, by reason of its coupling to capacitor 52, begins to operate as a detector, thereby causing the voltage at the cathode of diode 50 to increase. If this voltage increase were to go unchecked, diode 50 would become back-biased and would fail to attenuate the strong I.F. signals. However, the feedback amplifier 60 prevents the occurrence of this condition. As the voltage at the collector of transistor 70 tries to increase, it is applied to the base of transistor 70 as a bias voltage by the connection of diode 62, resistor 64, transistor 68 and resistor 72. This increasing bias voltage at the base of transistor 70 causes an increased current flow in the collector-to-emitter path of the transistor 70, which reduces the voltage at the cathode of diode 50. This increasing current flow through transistor 70 permits a greater current flow through diode 50, thereby maintaining the diode 50 in a low impedance state. The diode 50 will thus attenuate the strong I.F. signals at the input to the first I.F. amplifier 40, which prevents overloading of succeeding amplifying stages in the television receiver. It is seen that the negative feedback amplifier 60 effectuates such a result through its operation as a constant voltage source at the cathode of diode 50.

In FIG. 2, the first and second I.F. amplifiers 40 and 42, the negative feedback amplifier 60, and the AGC transfer circuit 100 are illustrated in schematic detail. The I.F. signal developed by the selectivity network 30 is coupled to the base of transistor 41 of the first I.F. amplifier 40. The collector of transistor 41 is coupled to the B+ supply, and its emitter electrode is coupled to ground by a resistor 49, and to the base of a transistor 43. Transistor 43 has an emitter electrode coupled to ground, and develops an output signal at its collector, which is coupled to an LC filter F1 and to the base of transistor 45 of the second I.F. amplifier 42.

The collector of transistor 45 is coupled to the B+ supply, and its emitter is coupled to ground by a resistor 46, to the base of a transistor 150 by a resistor 152, and to the base of a transistor 47. The emitter of transistor 47 is coupled to ground, and its collector is coupled to a second LC filter F2. Filters F1 and F2, in cooperation with the selectivity network 30, shape the passband for the I.F. amplifiers 40 and 42. The output signal from the second I.F. amplifier 42 is coupled to the third I.F. amplifier (not shown) by a capacitor 110 which is coupled to the tap of the inductor of filter F2.

The base of the first I.F. amplifier transistor 41 is coupled to the anode of the attenuator diode 50. The cathode of the diode 50 is coupled to ground by bypass capacitor 52, and to the input of the negative feedback amplifier 60. Feedback amplifier 60 is connected as described in FIG. 1, with resistor 66 coupled to the emitter of a transistor 112 of the AGC transfer circuit 100.

The AGC control voltage developed by AGC circuit 90 is applied across an AGC filter capacitor 92, and to the base of transistor 112 of the AGC transfer circuit 100. The transfer circuit 100 is outlined in FIG. 2 by a dashed box. The collector of transistor 112 is coupled to the B+ supply, and its emitter is coupled to ground by the series connection of resistors 114 and 116. The emitter of transistor 112 is also connected to the I.F. AGC bus 108 by the series connection of resistors 118, 120 and 124. A transistor 122 has its base electrode coupled to the junction of resistors 120 and 124. The collector of transistor 122 is coupled to the B+ supply, and its emitter is coupled to ground by a resistor 126, and to the base of a transistor 128. The emitter of transistor 128 is coupled to ground, and its collector is coupled to the junction of resistor 124 and the I.F. AGC bus 108.

The I.F. AGC bus 108 and the filter elements F1, F2 and F3 coupled to it, receive bias voltage from the B+ supply through a resistor 102. The I.F. bus 108 is coupled to the base of second I.F. amplifier transistor 45 by an LC filter F1 and to the base of first I.F. amplifier transistor 41 by an LC filter F3. The I.F. bus 108 is bypassed by I.F. frequencies by a capacitor 104 coupled from the I.F. bus 108 to ground.

A capacitor 154 is coupled from the base of transistor 150 to ground. The collector to emitter path of transistor 150 is coupled from the base of a transistor 162 to ground. Coupled across the collector to emitter path of transistor 150 is a capacitor 158 and a zener diode 156, which is reverse biased by the coupling of its anode to ground. A variable AGC delay resistor 160 is coupled from the B+ supply to the collector of transistor 150.

Transistors 162 and 164 are arranged in a Darlington configuration, with the collectors of the two transistors coupled to the B+ supply, and the emitter of transistor 162 coupled to the base of transistor 164. The emitter of transistor 164 is coupled to ground by the serial connection of resistors 166, 168, and 176. The junction of resistors 166 and 168 is coupled to the base of a transistor 170 by a resistor 174. Transistor 170 has its emitter electrode coupled to ground by a resistor 172, and supplies an AGC gain control voltage to the tuner 20 from its collector electrode.

The junction of resistors 168 and 176 is coupled to the base of a transistor 180, which has its collector coupled to the B+ supply and its emitter coupled to ground by the serial connection of a resistor 182 and the anode to cathode path of a diode 184. The junction of resistor 182 and the anode of diode 184 is coupled to the junction of resistors 114 and 116 by a resistor 130, and to the base of a transistor 186. The emitter of transistor 186 is coupled to ground, and its collector is coupled to the junction of resistors 118 and 120.

The AGC transfer circuit 100 generates the gain control voltages for the I.F. amplifiers 40 and 42 and the tuner 20 in response to the AGC control voltage developed across the AGC filter capacitor 92. When the television receiver is receiving a weak radio frequency signal (i.e., a maximum gain condition), the voltage across the filter capacitor 92 is low; and when a strong signal is received, the voltage across the filter capacitor 92 is high. Upon reception of a weak signal, the low voltage developed across the filter capacitor 92 is applied to the base of transistor 112, which causes that transistor to be essentially nonconducting. Only a very small current from the emitter of transistor 112 is available for the resistor path of resistors 118, 120 and 124, which maintains transistors 122 and 128 in a slightly conducting condition. With transistor 128 essentially turned off, the voltage on the AGC bus 108 remains high, and this high voltage is applied to the second I.F. amplifier 42 by filter F1 and to the first I.F. amplifier 40 by filter F3. The high AGC voltage causes I.F. amplifiers 40 and 42 to operate in a high gain condition.

Under weak signal conditions, diode 50 is nonconducting, to allow the AGC voltage and the I.F. signal applied to the base of transistor 41 by filter F3 to be as high as possible. Since transistor 112 is essentially nonconducting, its emitter voltage is low. This low voltage is applied to the feedback amplifier 60 by resistor 66, which turns off transistors 68 and 70. Thus, any current conducted by diode 50 will be stored on capacitor 52, until diode 50 is cut off, or back biased.

As the received radio frequency signal increases in strength, the voltage developed across capacitor 92 will increase, causing increased conduction by transistor 112. The increasing voltage at the emitter of transistor 112 is coupled to transistor 122, which begins to conduct current, thereby tuning on transistor 128. Transistor 128 conducts current away from the I.F. AGC bus 108, which reduces the voltage on the bus. The AGC voltage applied to the I.F. amplifiers 40 and 42 by filters F3 and F1 decreases, thereby reducing the gain of the I.F. amplifying transistors 43 and 47.

During this period of I.F. gain reduction, the increasing voltage at the emitter of transistor 112 is applied to the base of transistor 68 in the feedback amplifier 60 by resistor 66. Transistor 68, and thus transistor 70, will increase conduction, which lowers the voltage at the cathode of diode 50. The feedback amplifier 60 is biased so that the decreasing voltage at the cathode of diode 50 will follow, or track, the decreasing I.F. AGC voltage at the base of transistor 41. The tracking voltages applied to the electrodes of diode 50 will cause the flow of a small, constant current through diode 50 during I.F. (and tuner) gain reduction. Thus, diode 50 will not attenuate the input signal to the first I.F. amplifier 40 significantly at this time, and system gain will be controlled primarily by I.F. gain reduction.

After the I.F. amplifiers 40 and 42 have gone through a substantial portion of their gain control ranges, the signal to noise ratio of the received signal will be great enough to begin R.F. (tuner) AGC gain reduction without introducing an undesirable amount of noise into the I.F. signal. R.F. gain reduction may even be required at this point, to avoid overloading the mixer in the tuner, which converts the received radio frequency signals to I.F. frequencies. The signal level at which R.F. AGC gain reduction is to begin is controlled by the current provided by the variable resistor 160.

It is seen that the I.F. AGC voltage which is applied to the base of transistor 45 by filter F1 appears at the emitter of this transistor to gain control transistor 47. The AGC voltage component at the emitter of transistor 45 is also applied to the base of transistor 150. Capacitor 154 bypasses any I.F. frequency signals at the base of transistor 150 to ground. Under weak signal conditions, the high I.F. AGC voltage which is translated to the base of transistor 158 maintains that transistor in a saturated condition.

As the I.F. AGC voltage decreases during I.F. gain reduction, the voltage at the base of transistor 150 will follow, until transistor 150 comes out of saturation and begins conducting less of the current supplied by the variable resistor 160. The decreasing current conduction by transistor 150 will increase the voltage at the base of transistor 162 until a point is reached at which transistors 162 and 164 begin to turn on, and R.F. gain reduction is initiated. This point is determined by the setting of variable resistor 160, which provides current to the base of transistor 162 and the collector of transistor 150. Transistors 162 and 164 are arranged in a Darlington configuration to present a high base impedance to the current supplied by variable resistor 160. The point of R.F. gain reduction will thus be virtually unaffected by the base current conducted by transistor 162.

As transistor 164 turns on, its emitter voltage rises, and the voltage coupled to the base of transistor 170 by resistors 166 and 174 will likewise increase. Transistor 170 will then begin to turn on, and its collector voltage will start to decrease. The collector of transistor 170 is coupled to the tuner 20, and the decreasing collector voltage of the transistor effects R.F. gain reduction in the tuner.

Since R.F. gain reduction is initiated and controlled by the decreasing I.F. AGC voltage on bus 108, it is seen that I.F. gain reduction continues while the tuner is proceeding through its range of gain reduction. However, since transistor 150 is a high gain device, the range of R.F. gain reduction is traversed quite rapidly by comparison with the concurrent I.F. gain reduction. In a typical television receiver, the AGC system described herein will cause the I.F. gain to decrease by approximately 6 decibels, while the tuner traverses its entire range of gain control of approximately 40 decibels.

If the strength of the received signal continues to increase after R.F. gain reduction has run its course, the AGC system commences yet a third mode of gain reduction. As the tuner approaches the end of its range of gain control (i.e., minimum gain), the increasing voltage at the emitter of transistor 164 is applied to the base of transistor 180 by resistors 166 and 168, causing transistor 180 to begin conduction. The voltage at the emitter of transistor 180 will increase, thereby causing transistor 186 to begin conducting current. Transistors 180 and 186 comprise a negative feedback path in the AGC system, and their conduction causes a portion of the increasing current flow through resistors 118 and 120 to be bypassed to ground through transistor 186. The reduced rate of increasing current flow through resistors 120 and 124 will cause a reduction in the rate at which current conduction by transistor 128 had been increasing, and a slowing of the rate of I.F. AGC voltage decrease on the I.F. AGC bus 108. With the rate of gain reduction thereby reduced, an increase in the received radio frequency signal will result in an increase in the video signal level, which will be detected by the AGC circuit 90, and the AGC control voltage developed across filter capacitor 92 will increase sharply to oppose this video signal increase. This sudden voltage increase at the base of transistor 112 will cause that transistor to conduct even harder, and its emitter voltage will increase still further.

The increasing emitter voltage of transistor 112 is coupled to the negative feedback amplifier at the base of transistor 68 by resistor 66. The negative feedback amplifier 60 is now in a high gain condition, and only a small reduction in the rate of increasing gain reduction by the AGC system will cause a large increase in conduction in the negative feedback amplifier transistors 68 and 70. The increased conduction by transistor 70 will rapidly decrease the voltage at the cathode of diode 50, which strongly forward biases the diode. Moreover, as transistor 186 conducts an increasing amount of current through resistor 118, transistors 122 and 128 will eventually be turned off, as diode 50 simultaneously draws an increasing amount of current from the I.F. AGC bus 108. Thus, current that would otherwise be drawn from the I.F. AGC bus 108 by the increased conduction of transistor 128 is now conducted from the diode 50, causing diode 50 to present a low impedance at the base of transistor 41. The diode 50 will now act as an attenuator for I.F. signals at the input of the first I.F. amplifier 40, thereby effecting a further reduction in system gain. The bias current conducted by diode 50 through filter F3 will act to reduce the voltage on the I.F. AGC bus 108, thus keeping the gain of the I.F. amplifiers and the tuner at a minimum.

What is claimed is:

1. An overload protected amplifier for use with a source of input signals subject to variations in signal level, comprising:
    an amplifying device having an input electrode, an output electrode, and a common electrode;
    means for coupling said signal source between said input and common electrodes of said amplifying device;
    a unidirectionally conducting semiconductor device having an input electrode coupled to the input electrode of said amplifying device, and having an output electrode;
    a capacitor coupled between the output electrode of said semiconductor device and the common electrode of said amplifying device; and
    means responsive to the level of the voltage across said capacitor for opposing changes in said voltage level, wherein
    said unidirectionally conducting semiconductor device conducts current from said input electrode of said amplifying device to the junction of said capacitor and said voltage change opposing means; and
    said voltage change opposing means comprises an amplifier having a negative feedback path, and further comprising means for biasing said amplifier for determining the voltage to be maintained across said capacitor.

2. The overload protected amplifier of claim 1, wherein:
    said amplifying device comprises a television intermediate frequency amplifier, and said output electrode of said amplifier is coupled to a filter circuit tuned to resonate at an intermediate frequency of the television system.

3. The overload protected amplifier of claim 1, further comprising:
    means responsive to variations in the levels of said input signals within a given range of signal variations for generating a correspondingly varying biasing signal,
    wherein said biasing means is responsive to said varying biasing signal for altering the voltage level to be maintained at the output electrode of said semiconductor device.

4. The overload protected amplifier of claim 1, wherein:
    said source of input signals comprises a gain controlled radio frequency amplifier for receiving and amplifying a radio frequency signal and converting said signal to an intermediate frequency signal;
    said amplifying device comprises a gain controlled intermediate frequency amplifier having an input coupled to receive said intermediate frequency signal; and further comprising
    an automatic gain control circuit for generating gain control signals for said radio frequency and said intermediate frequency amplifiers and a biasing signal for said negative feedback amplifier,
    wherein said automatic gain control circuit is operable in:
    (1) a first mode, wherein said gain control signals cause radio frequency and intermediate frequency amplifiers to operate in a maximum gain condition and said biasing signal causes the voltage at the output electrode of said semiconductor device to render said semiconductor device essentially nonconducting;
    (2) a second mode, wherein said gain control signals cause said radio frequency amplifier to operate in a maximum gain condition and said intermediate frequency amplifier to operate in a reduced gain condition, and said biasing signal causes said negative feedback amplifier to conduct a first amount of current through said semiconductor device;
    (3) a third mode, wherein said gain control signals cause said radio frequency and intermediate frequency amplifiers to operate in a reduced gain condition, and said biasing signal causes said negative feedback amplifier to conduct said first amount of current through said semiconductor device, and
    (4) a fourth mode, wherein said biasing signal causes said negative feedback amplifier to conduct a second amount of current through said semiconductor device which is substantially greater than said first amount so as to attenuate the intermediate frequency signal at the input to said intermediate frequency amplifier, and to cause said radio frequency and said intermediate frequency amplifiers to operate in a reduced gain condition.

5. The circuit of claim 1, wherein:
    said semiconductor device comprises a diode having an anode electrode coupled to the input electrode of said amplifying device, and a cathode electrode coupled to the junction of said capacitor and said negative feedback amplifier; and said negative feedback amplifier comprises:

a first transistor having an input electrode and an output electrode; and a second transistor having an output electrode coupled to the input electrode of said first transistor, and an input electrode coupled to the output electrode of said second transistor, wherein said biasing means is coupled to the input electrode of said first transistor, and the junction of the output electrode of said second transistor and the input electrode of said first transistor is coupled to the cathode of said diode.

* * * * *